United States Patent [19]

Yuasa et al.

[11] Patent Number: 4,465,370
[45] Date of Patent: Aug. 14, 1984

[54] LIGHT MEASURING DEVICE

[75] Inventors: Yoshio Yuasa, Kawachinagano; Nobukazu Kawagoe, Sakai, both of Japan

[73] Assignee: Minolta Camera Kabushiki Kaisha, Osaka, Japan

[21] Appl. No.: 279,215

[22] Filed: Jun. 30, 1981

[30] Foreign Application Priority Data

Jul. 1, 1980 [JP] Japan .................................. 55-90323

[51] Int. Cl.³ .......................... G01J 1/46; G01R 17/02; G08C 9/06
[52] U.S. Cl. ................................. 356/224; 324/99 D; 340/347 NT; 356/222
[58] Field of Search ............... 356/215, 218, 222, 224, 356/226; 340/347 NT; 324/99 D

[56] References Cited

U.S. PATENT DOCUMENTS

| | | | |
|---|---|---|---|
| 3,102,921 | 9/1963 | Peras | 356/215 |
| 4,082,998 | 4/1978 | Marriott | 324/99 D |
| 4,107,667 | 8/1978 | Kronlage | 324/99 D |
| 4,203,668 | 5/1980 | Chapman | 356/215 |

Primary Examiner—Bruce Y. Arnold
Attorney, Agent, or Firm—Wenderoth, Lind & Ponack

[57] ABSTRACT

A light measuring device includes one or more photodiodes, which generate current in relation to the received light, and at least one capacitor for integrating the generated current. The amount of charge stored in the at least one capacitor at the completion of the integration is roughly detected by the number of capacitors used and/or the voltage across the capacitor. A current source capable of producing different levels of current in accordance with the detected amount of charge is provided for changing the amount of charge stored in the at least one capacitor. The time needed to change the amount of charge stored in the at least one capacitor is measured so as to obtain the value of total amount of the change in the charge stored in the at least one capacitor and to thus obtain the value of the received amount of light intensity.

35 Claims, 7 Drawing Figures

LIGHT MEASURING DEVICE

BACKGROUND OF THE INVENTION

The present invention relates to a light measuring device of the type having a dual-slope A/D converter wherein an electric charge of an amount which is commensurate with an amount or intensity of light measured by a photoelectric means is stored in one or more capacitors and is measured by measuring the time period during which the charge stored in the capacitor or capacitors is lowered to a predetermined level by a predetermined level of constant current, so that the measured time represents the measured amount or intensity of light. The measured time is usually converted to a digital signal such as, for example, the number of pulses counted during that time.

While a dual-slope A/D converter is advantageous in providing an accurate A/D conversion, conventional dual-slope A/D converters have had disadvantages in that they are slow in operation and cannot simultaneously convert a plurality of signals. Furthermore, when an input signal varies widely, e.g. from 0 to $2^{16}$, the time required for the conversion varies greatly.

The increase the speed of the dual-slope A/D conversion, some approaches have been made, such as the Triple-Ramp System, the Series-Integration System and the Quadraphasis System. These systems are designed to switch the rate of discharge, i.e. the level of the discharge current, per one clock period during the discharge process, thereby increasing the speed or rate of the conversion while maintaining its accuracy. In such systems, A/D conversion is effected for the full range with the minimum resolution maintained constant. However, such a full range conversion with a constant resolution is not always necessary, but it is sometimes the case that digital signals with only a particular number of bits are necessary while the minimum resolution may be shifted in accordance with the magnitude of the signal to be converted. For example, upon the conversion to sixteen bits of a digital signal, a signal of ten bits may be necessary while the minimum resolution may vary between 1, 2, 4, 8, 16, 32 and 64 bits. For such a case, the above noted systems operate with unnecessarily high accuracy.

Furthermore, in the above noted systems, the moment when the level of the discharge current is switched during the discharging operation must be synchronized with the clock pulse signal used for measuring the time period.

Furthermore, the time required to carry out the A/D conversion of data for a high intensity or amount of light takes a considerably longer time as compared with the time required for a low intensity or amount of light. Therefore, when sequentially carrying out a plurality of measuring operations according to a previously arranged program, it is difficult to control the timing relationship between the operations.

In order to overcome the above described disadvantages, there has been proposed an improved type of range changing system, e.g., disclosed in H. Ohtsuka et al.'s Japanese Patent Application which was laid-open to public inspection as (Tokkaisho) No. 53-63843, and published June 7, 1978, in which a plurality of capacitors and a switch coupled to each capacitor are provided, the capacitors being connected in parallel. When a current to be integrated is present, the switch coupled to the first capacitor is turned on to effect the integration of current only in the first capacitor. During the integration, the voltage across the first capacitor is measured, and when it reaches a predetermined level, the switch coupled to the second capacitor is also turned on so as to continue the integration in both the first and second capacitors. The turning on of the second switch is automatically carried out, and thus, it can be said that the range is automatically changed. In this manner, the switches are sequentially turned on so as to discretely increase the total capacitance, and when the integration is over, the number of switches which have been turned on is detected so as to obtain the total capacitance of the capacitors used for the integration, and, at the same time, the voltage across the capacitors is measured so as to determine the total charge stored in the capacitors.

SUMMARY OF THE INVENTION

It is a primary object of the present invention to provide an improved light measuring device which is free from the above described disadvantages, and yet is different from the above described H. Ohtsuka et al.'s range changing system.

It is another object of the present invention to provide a light measuring device of the above described type in which the proper range for the measurement can be automatically selected during the measurement.

It is a further object of the present invention to provide a light measuring device of the above described type in which the amount of charge stored in the integrating capacitor or capacitors is changed as a function of the light measurement and the changed amount of charge can be measured by measuring the period of time it took to supply a predetermined constant current that recharges or discharges the capacitor (or capacitors) to its (their) initially charged value.

It is a still further object of the present invention to provide a light measuring device of the above described type in which the current for discharging or recharging the capacitor or capacitors can be so controlled as to present different current levels to shorten the time of the measuring operation.

It is another object of the present invention to provide a light measuring device of the above described type in which the discharging or recharging current level is determined in dependence upon the amount of charge stored in the capacitor or capacitors, or by the light intensity of the target object with is instantaneously obtained by the light receiving element.

It is a further object of the present invention to provide an improved dual-slope A/D converter having its recharge or discharge time varied in accordance with the changed amount of charge stored in an integration capacitor.

It is still further object of the present invention to provide a improved dual-slope A/D converter which can change its conversion time in accordance with its input.

It is a yet further object of the present invention to provide an improved dual-slope A/D converter which is, although not exclusively, suitable for use in light measuring devices with multiple photo elements and having outputs which are successively converted to digital signals by the converter.

It is yet another object of the present invention to provide a light measuring device of the above described type which can simultaneously measure the amount of light under various conditions.

To accomplish these and other objects, a light measuring device according to the present invention comprises a light responsive means for receiving light and for producing an electrical signal as a function of the received light and an integration means including a capacitor means for integrating the electrical signal so as to change the amount of charge stored in the capacitor means. The light measuring device further comprises a first control means for controlling the integration means such that the electrical signal is integrated during a predetermined period of time, a means for setting the capacitor means to a predetermined initial condition before the integration of the electrical signal, a means for producing a plurality of constant currents having different levels, and a means for selecting one of the plurality of constant currents in dependence on the changed amount of charge in the capacitor means. It further comprises a second control means for controlling the constant current producing means such that the selected constant current is supplied to or withdrawn from the capacitor means subsequent to the completion of the integration of the electrical signal for the predetermined period of time, so as to place the capacitor in its predetermined initial condition, a means for detecting the moment of time when the capacitor means again reaches its predetermined initial condition due to the selected constant current, and a means for measuring the time interval from the moment of time when the constant current producing means starts to supply the selected constant current to the capacitor means to the moment of to the moment of time when the detecting means detects that the capacitor means has again reached its predetermined initial condition.

It is to be noted that the present invention is applicable not only to the case where one or more integrating capacitor is charged from its short-circuited condition to a voltage corresponding to a time integrated measured light signal, and then discharged with a constant current to its intial condition, but also the case where the capacitor is discharged from an initial charged condition of a given level, e.g.—the source voltage level, to a level corresponding to said time integrated amount and then charged to its initial condition by the constant current. To cover the both cases, the term "integrate" or "integration" is sometimes used hereinafter for the charging or discharging of the capacitor from the initial condition to the time integrated level and the term "reversely integrate" or "reverse integration" is sometimes used hereinafter for the discharging or recharging of the capacitor by the constant current to its initial condition.

BRIEF DESCRIPTION OF THE DRAWINGS

These and other objects and features of the present invention will become apparent from the following description taken in conjunction with preferred embodiments thereof with reference to the accompanying drawings, in which.

DESCRIPTION OF THE PREFERRED EMBODIMENTS

Figure 1:
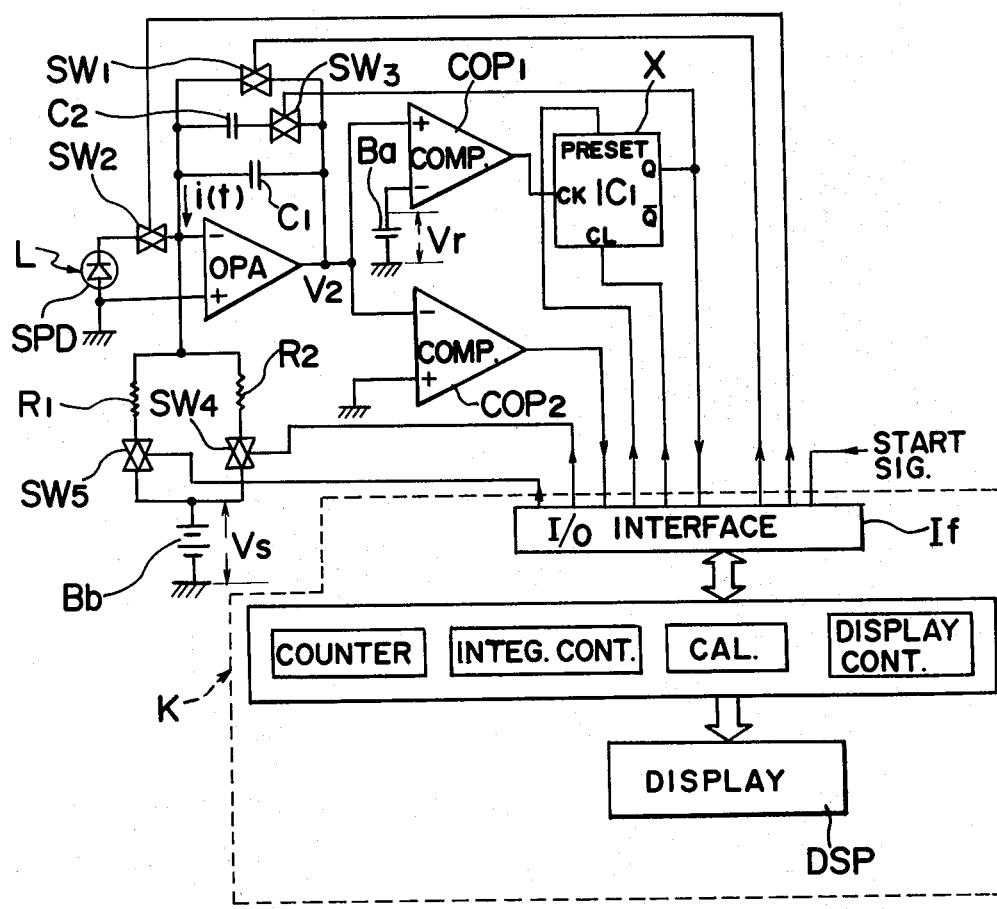
FIG. 1 is a circuit diagram of a light measuring device according to the first embodiment of the present invention.

Before the description of the present invention proceeds, it is to be noted that like parts are designated by like reference numerals throughout the accompanying drawings.

Referring to FIG. 1, there is shown a light measuring device according to the first embodiment of the present invention. The light measuring device shown comprises a silicon photodiode SPD which is used as a photoelectric or light-current converting means and which is connected in series with a switch SW2; the photodiode SPD and the switch SW2 are connected between two inputs of an operational amplifier OPA. A first integrating capacitor C1 is connected between the inverting input and the output of the operational amplifier OPA. Similarly, a second integrating capacitor C2 which is connected in series with a switch SW3 is connected between the inverting input and the output of the operational amplifier OPA. Furthermore, a switch SW1 is connected between the inverting input and the output of the operational amplifier OPA. The inverting input of the operational amplifier OPA is also connected to a series connection of resistor R1, switch SW5 and a constant voltage source Bb which has a potential Vs. When the switch SW5 is on, the constant voltage source Bb provides a certain level of current, determined by the resistance of the resistor R1, to the integrating capacitor C1 or capacitors C1 and C2 so as to discharge the capacitor or capacitors. Similarly, series connected another resistor R2 and switch SW4 are connected in parallel to the series connection of the resistor R1 and switch SW5 for providing, when the switch SW4 is on, a different level of current to the integrating capacitor or capacitors. It is to be noted that the switches SW1 to SW5 are preferably formed by semiconductor switches. The output of the operational amplifier OPA is connected to a non-inverting input of a comparator COP1 and also to an inverting input of a comparator COP2. The inverting input of the comparator COP1 is connected to a constant voltage source Ba, and the non-inverting input of the comparator COP2 is connected to ground. Accordingly, the comparator COP1 produces a high level signal when the voltage V2 produced by the operational amplifier OPA, during its increase, exceeds the reference voltage Vr and the comparator COP2 produces a high level signal when the voltage V2, during its decrease, reaches the ground level. The output of the comparator COP1 is connected to a switching circuit X formed by a flip-flop circuit which includes preset terminal, a clock terminal, a clear terminal and a Q-terminal; the Q terminal produces a high level signal by the step up of an input to the preset terminal, and the output from the $\overline{Q}$ terminal changes its state from high to low or vice versa by the step up of an input to the clock terminal. Initially, the switching circuit X is supplied with a signal at the preset terminal so as to produce a high level signal from the Q terminal. The output from the Q terminal is then forcibly set to a low level signal by a signal supplied to the clear terminal so as to open switch SW3. When the comparator COP1 produces a high level signal, the output from the Q terminal changes from low to high, and this high level signal from the Q terminal changes the switch SW3 from off to on.

In the aforementioned embodiment, the integration control for the integrating circuit including capacitors C1 and C2, and the calculation and display in accordance with the output of the integrating circuit are performed by a microcomputer K having an input and output interface If, a processing unit which functions as a time counter, an integration controller, a calculator and display controller, and a display unit DSP. The input and output interface If provides various signals in a timed relationship to the switches SW1 to SW5 and also to the switching circuit X, and receives signals from the comparator COP2 and switching circuit X, and also receives a start signal. The manner in which these various signals control the circuit operation will become apparent from the following description.

Figure 2:
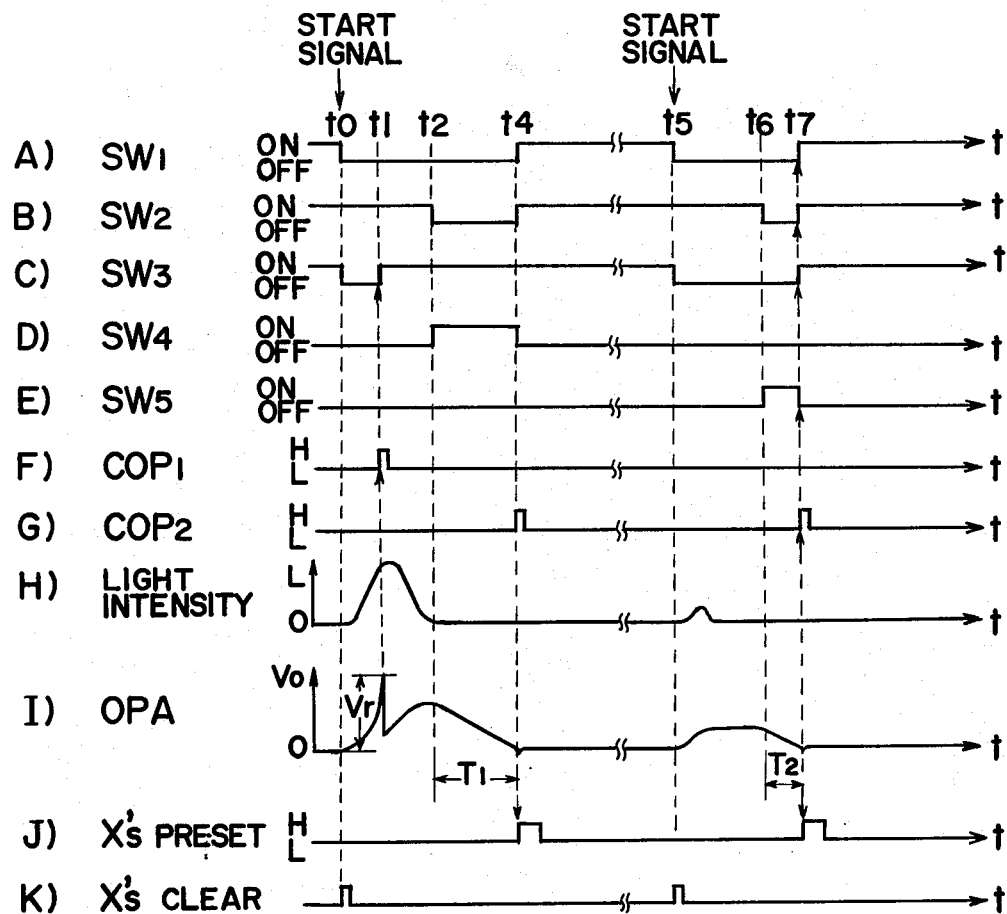
FIG. 2 is a graph showing waveforms obtained from major points in the circuit of FIG. 1.

Referring also to FIG. 2 showing the time chart of waveforms appearing at various points in FIG. 1 circuit, the light measuring device of the first embodiment is initially set in such a condition that the switches SW1, SW2 and SW3 are turned on and switches SW4 and SW5 are turned off (waveforms A, B, C, D and E in FIG. 2). Upon receipt of a start signal, switches SW1 and SW3 are turned off. Thereupon, the capacitor C1 starts to integrate the current i(t) generated by the silicon photodiode SPD so as to gradually increase the voltage V2 at the output of the operational amplifier OPA. When the target object is very bright, the voltage V2 exceeds the reference voltage Vr at a time t1 during the measurement, whereby the comparator COP1 produces a high level signal causing the Q terminal of the switching circuit X to produce a high level signal, and accordingly, the switch SW3 is turned on. Thereafter, the current i(t) is integrated in both capacitors C1 and C2. This change of connection of the capacitors, i.e. the change of capacitance for the integration at the time t1 can be understood to be a change of measuring range from low to high. Then, at a time t2, the input and output interface If produces an integration stop signal that turns the switch SW2 off, and at the same time, it also produces a signal that turns the switch SW4 on. It is to be noted that when the switch SW4 turns on, the microcomputer K starts incrementing the time in the time counter. When the switch SW4 is turned on, a current is determined by the resistor R2, i.e., the current is equal to Vs/r2 (when r2 is the resistance of the resistor R2) (In a similar fashion, the capacitance and resistance of the elements explained herein are indicated by the same but small character.) The above noted is then supplied to the capacitors C1 and C2 to forcibly discharge the capacitors C1 and C2 at a predetermined constant rate. Accordingly, the voltage V2 linearly decreases until it reaches the ground level at a time t4, at which time the comparator COP2 produces a high level signal which is supplied to the microcomputer K. Upon receipt of such a high level signal from the comparator COP2, the microcomputer K stops incrementing the time in the time counter, and at the same time, signals for turning the switches SW1, SW2 and SW3 on and signals for turning the switches SW4 and SW5 off are produced. Furthermore, the microcomputer K produces, at the time t4, a preset signal which is supplied to the switching circuit X. Accordingly, the switches SW1 to SW5 and the switching circuit X are returned to their initial condition and are ready for the next operation. In the microcomputer K, the counted time interval T1 (see waveform I in FIG. 2) is used for the calculation of the measured light amount with the information of finally set range, and the calculated amount is indicated by the display unit DSP.

Next the operation in the case when the target object is relatively dark is explained.

When the start signal is provided at a time t5, the capacitor C1 starts to integrate the current i(t). Since the brightness in this case is relatively low, the voltage V2 produced by the operational amplifier OPA will not reach the reference voltage Vr within the predetermined measuring period, i.e., t5-t6, and accordingly, no change of measuring range from low to high is effected in this operation. At a time t6, the input and output interface If produces an integration stop signal that turns the switch SW2 off, and at the same time, it produces a signal that turns the switch SW5 on. In a similar manner to that described above, when the signal that turns the switch SW5 on is produced, the microcomputer K starts incrementing the time in the counter. When the switch SW5 is turned on, a current determined by the resistor R1, i.e. a current equal to Vs/r1, is applied to the capacitor C1 to forcibly discharge the capacitor C1 at a predetermined constant rate. Accordingly, the voltage V2 linearly decreases and when it reaches the gound level at a time t7, the comparator COP2 produces a high level signal which is used for stopping the time count and setting the switches and the switching circuit X to their initial conditions, as described above in the previous operation. Thereafter, the microcomputer K calculates and displays the measured light amount.

As understood from the above description, the current Vs/r1 is used for discharging the capacitor C1 and current Vs/r2 is used for discharging the capacitors C1 and C2. The reason for providing different currents is to arrange the discharging period so as to be within a predetermined length of time. According to a preferred embodiment, these two currents have such values that the time for discharging the fully charged capacitor C1 by the current Vs/r1 is equal to the time for discharging the fully charged capacitors C1 and C2 by the current Vs/r2. The relationship between the resistors R1 and R2 that meets the above requirements is explained below.

Since the voltage across the fully charged capacitor C1 can be considered to be equal to the voltage across the fully charged capacitors C1 and C2 connected in parallel, $$c1/Q1 = (c1+c2)/Q2$$

wherein Q1 is the maximum charge in the capacitor C1 and Q2 is the maximum charge in the coupled capacitors C1 and C2. Generally, the relationship between the current i and charge q can be expressed as $$\int_0^T i\, dt = q.$$

Therefore, for discharging the capacitor C1, $$\int_0^T Vs/r1\, dt = Q1 \qquad (2)$$

is obtained, and for discharging the capacitors C1 and C2, $$\int_0^T V_s/r2 \, dt = Q2 \quad (3)$$

is obtained. From the equations (1), (2) and (3), $$\frac{1}{c1} \int_0^T V_s/r1 \, dt = \frac{1}{c1+c2} \int_0^T V_s/r2 \, dt \quad (4)$$

is obtained. Thus, $$r1/r2 = (c1+c2)/c1. \quad (5)$$

When the relationship (5) is satisfied, the discharging time for discharging the capacitor C1 and the discharging time for discharging the coupled capacitors C1 and C2 will be the same not only when they are charged fully, but also when they are charged to the same certain percentage with respect to each other. Therefore, if the capacitors C1 and C2 have the relationship, for example, $c1+c2=10c1$, and the resistors R1 and R2 are set to satisfy the equation (5), the light amount measured under a high range using the capacitors C1 and C2 is equal to 10 times the light amount measured under low range using the capacitors C1, provided that the percentage of the charged amount is the same. In this case, the discharging time is the same. Accordingly, it is possible to use the same counter with the same clock pulses for counting time in both ranges.

Although the above described embodiment is directed to a case wherein the current generated from the silicon photodiode SPD is used for charging the capacitor C1 or capacitors C1 and C2, while the current obtained through the resistors R1 or R2 is used for discharging the capacitor or capacitors, a similar operation can be obtained when the current from the silicon photodiode SPD is used for discharging the initially charged capacitor C1 or capacitors C1 and C2, and the current through the resistors R1 or R2 is used for charging the capacitor or capacitors to an initial value. In this case, the voltage across the capacitor C1 or capacitors C1 and C2 should be set to given level at the beginning of operation and the comparator COP2 should produce a signal when the voltage V2 reaches the given level.

As apparent from the above embodiments, the light measuring device according to the present invention can automatically change its measuring range from low to high during the measuring operation so that it is possible to carry out the measuring operation over a wide region through a single measuring operation without causing any failure in the selection of the proper range.

It is to be noted that the measuring range, which has been described as being provided in two ranges, i.e., high and low ranges, can be provided in more than two ranges, such as, in three or four ranges.

Figure 3:
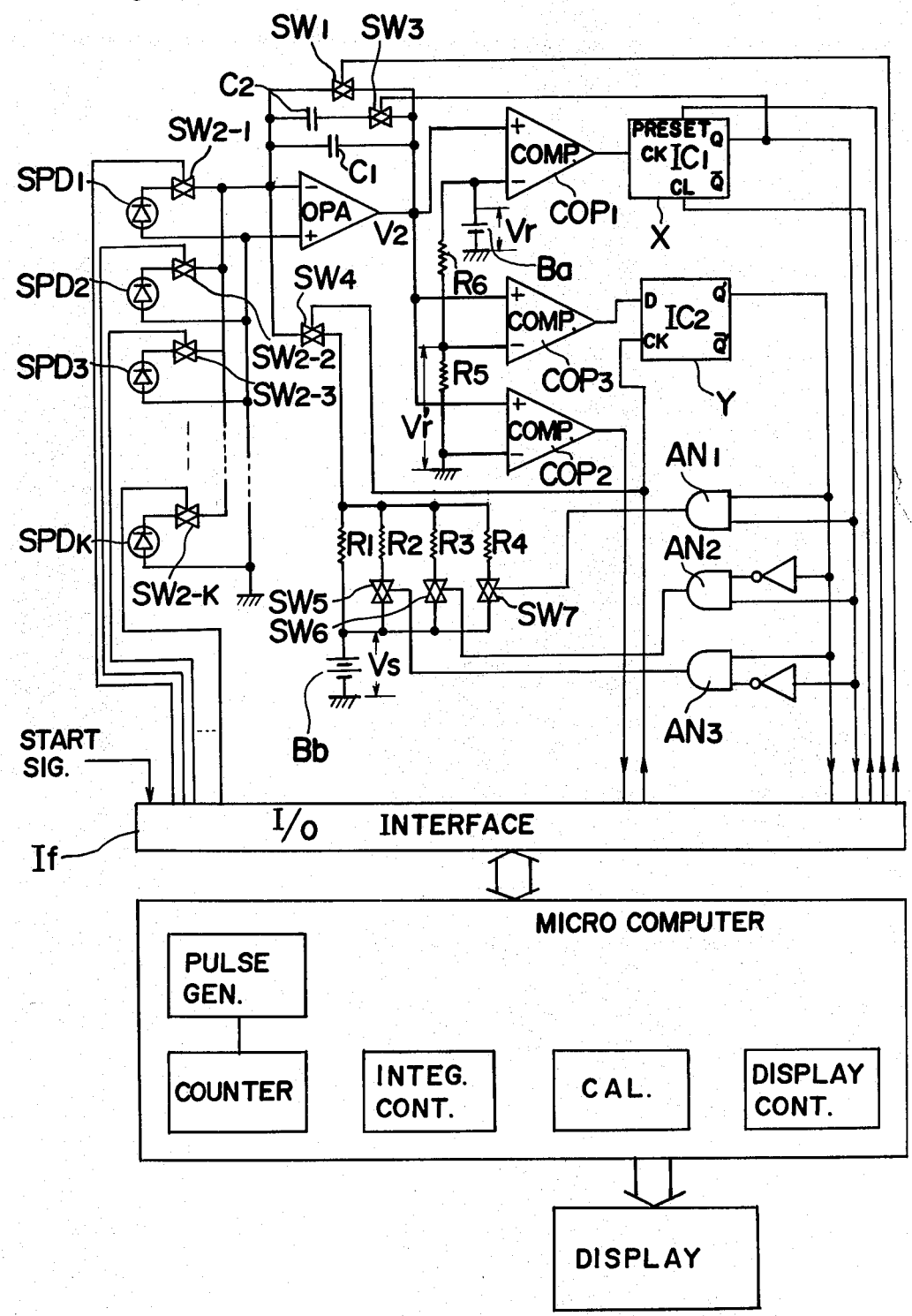
FIG. 3 is a circuit diagram of a light measuring device according to the second embodiment of the present invention.

Referring to FIG. 3, there is shown a second embodiment of the light measuring device which is improved from the first embodiment. The light measuring device according to the second embodiment comprises a plurality of silicon photodiodes SPD1 to to SPDk which are used as a photoelectric means and which are respectively coupled to analog switches SW2-1 to SW2-k. Each photodiode is connected to the inputs of the operational amplifier OPA in a similar manner to that described above. The switches SW2-1 to SW2-k are connected to input and output interface If of a microcomputer such that one selected switch is turned on and the remaining switches are maintained off so as to enable selective use of just one photodiode. According to a preferred embodiment, the photodiodes SPD1 to SPDk are positioned under different light measuring conditions, e.g., arranged to receive light or radiation through different filters for spectral analyzation of a measured object. The A/D conversion according to the second embodiment is carried out in a manner similar to that of the first embodiment. More particularly, the capacitor C1 or the combined capacitors C1 and C2, depending on the brightness of the target object, is first charged to a level commensurate with the amount of light received from the target object, and then is discharged by a constant current of a predetermined value. The charged level of the capacitor or capacitors, i.e., the received light amount, is measured by the time it took to discharge the capacitor or capacitors to a given level.

In the first embodiment described above, the current for discharging the capacitor C1 and the current for discharging the capacitors C1 and C2 are set at a predetermined level for each. According to the second embodiment, however, the current for discharging the capacitor C1 has two different levels which are selected in relation to the charged level of the capacitor C1, and similarly, the current for discharging the capacitors C1 and C2 has two different levels, thus in total, four different current discharge levels are used. The purpose of this arrangement described in detail below is to further shorten the measuring period.

Referring to FIG. 3, four resistors R1, R2, R3 and R4 are provided in parallel between the constant voltage source Bb that produces the voltage Vs, and a switch SW4. Of the resistors R1 to R4, resistors R2, R3 and R4 are respectively coupled to analog switches SW5, SW6 and SW7. The switch SW4 is connected in turn to the capacitors C1 and C2 so as to supply a discharge current of a selected value to the capacitor C1 or capacitors C1 and C2. The output V2 of the operational amplifier OPA is connected to three comparators COP1, COP2 and COP3. The comparator COP1 compares the output voltage V2 with the voltage Vr to select the range, and the comparator COP2 compares the output voltage V2 with the ground level to detect the time when the capacitor C1 or the capacitors C1 and C2 are completely discharged, in a similar manner to that described above. The comparator COP3 compares the output voltage V2 with a voltage Vr', which falls between the voltage Vr and ground level and is determined by voltage dividing resistors R5 and R6, to determine whether the voltage V2 is above or below the reference voltage Vr'. The output of the comparator COP1 is connected to the switching circuit X, e.g., an R-S flip-flop circuit, and the output of the switching circuit X, i.e., the terminal Q is connected to the switch SW3 and the input and output interface If, and also to one input of each of the AND gates AN1, AN2 and AN3. It is to be noted that the output terminal Q of the switching circuit X is connected to the AND gate AN3 through an inverter. The output of the comparator COP2 is connected to the input and output interface If and the output of the comparator COP3 is connected to a data input terminal D of another switching circuit Y, e.g. a D-flip-flop circuit which in turn has a clock terminal CK that receives a signal from the input and output interface If, and an output terminal Q' which is connected to the input and output interface If and also to one input of each of the AND gates AN1, AN2 and AN3. It is to be noted that the output terminal Q' of the switching circuit Y is connected to the AND gate AN2 through an inverter. The outputs of the AND gates AN1, AN2 and AN3 are respectively connected to the switches SW5, SW6 and SW7. The switch SW4, which receives the same signal that is supplied to the clock terminal CK of the switching circuit Y, is turned on immediately after the completion of the integration by the capacitor C1 or the capacitors C1 and C2 and is turned off in response to the high level signal produced by the comparator COP2 via the microcomputer, i.e., at the end of the discharge. The switching circuit Y is also supplied with a high level signal during the same period of time. Accordingly, at a time immediately after the completion of the integration by the capacitor C1 or the capacitors C1 and C2, the signal supplied to the data input D of the switching circuit Y is held in the switching circuit Y and output from its terminal Q'. By the combination of high and low level signals produced from the switching circuits X and Y, the discharging current that flows through the switch SW4 can be set to four different levels, corresponding to the measurements under four different conditions. The operations under four different conditions are explained below with reference to the time chart of FIG. 4.

Figure 4:
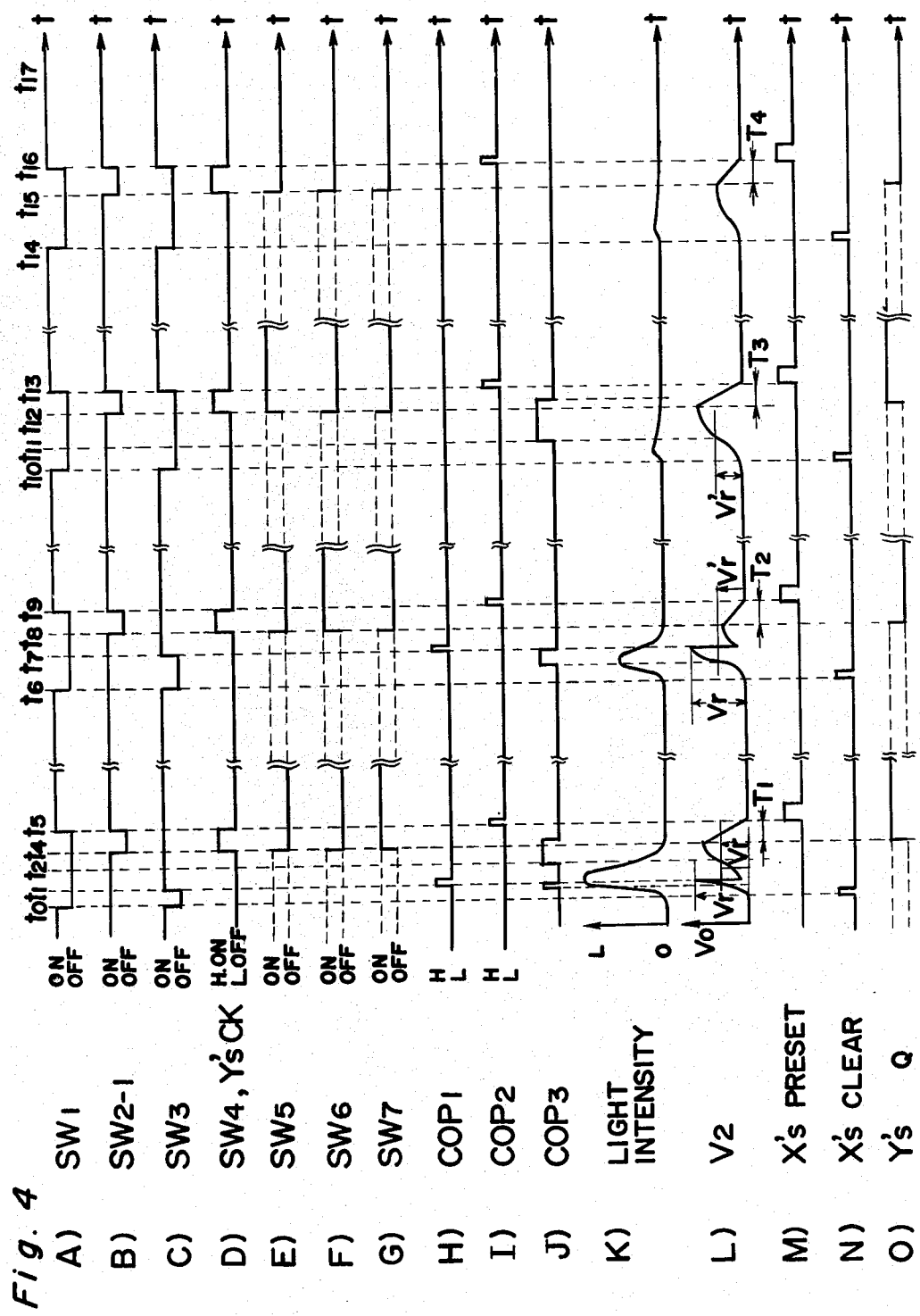
FIG. 4 is a graph showing waveforms obtained from major points in the circuit of FIG. 3.

In FIG. 4, the first, second, third and fourth measuring operations are shown to be respectively carried out in the time intervals between times t0–t6, t6–t10, t10–t14 and t14–t17. As understood from the curve of light intensity shown in K), the operation changes from first to fourth to present four different conditions with the change of the brightness of the target object from very high, to high, to low and to very low. As will be understood from the further description, the first and second measuring operations are adapted for the high range measurement and the third and fourth measuring operations are adapted for the low range measurement. It is to be noted that in the actual operation, only one of the four operations mentioned above is carried out to complete one light measuring operation. As apparent to those skilled in the art, the choice of the four operations to be selected is determined by the brightness of the target object.

In any one of the measuring operations, the switches SW1 to SW7 are initially turned to such states that: switch SW1, switch SW2-1 (this switch being selected merely for explanatory purposes, and thus can be any one of switches SW2-1 to SW2-K while the non-selected switches are left turned off) and switch SW3 are turned on; switch SW4 is turned off; and switches SW5, SW6 and SW7 are in the states set by the previous operation.

The first operation starts by the receipt of the start signal at a time t0, and thereupon, the switches SW1 and SW3 are turned off to initiate the integration of the current generated by the photodiode SPD1 by the capacitor C1. As the integration proceeds and when the output voltage V2 exceeds the voltage Vr', the comparator COP3 produces a high level signal. A further integration by the capacitor C1 increases the voltage V2 and when the voltage V2 exceeds the voltage Vr at a time t1, the comparator COP1 produces a high level signal for changing the light amount measuring range from low to high, and accordingly, the switch SW3 is turned on to integrate the current from the photodiode SPD1 with both capacitors C1 and C2 in the same manner described above. It is to be noted that when the switch SW3 is turned on, the voltage V2 suddenly drops below the voltage Vr', and accordingly, the comparator COP3 which has been producing a high level signal produces a low level signal. A still further integration by the capacitors C1 and C2 again causes the increase of voltage V2 above the voltage Vr' to produce a high level signal from the comparator COP3 at a time t2. Then, after a predetermined measuring period from the time t0, i.e., at a time t4, the switch SW2-1 opens, and at the same time, the clock terminal CK of the switching circuit Y receives a high level signal from the input and output interface If so as to hold and produce the output signal of comparator COP3 from the terminal Q'. At this time, since the switching circuit X's terminal Q is producing a high level signal indicative of the high range, the AND gates AN1, AN2 and AN3 respectively produce high, low and low level signals. Accordingly, the switch SW7 is turned on to supply a discharging current determined by the parallel connected resistors R1 and R4, i.e., the current is equal to $Vs(r1+r4)/r1 \cdot r4$ and flows through the switch SW4 which was turned on at the time t4. Then, discharging period T1 is measured, and thereafter, the amount of light is calculated and displayed in the same manner as described above.

The second operation starts by the receipt of the start signal at a time t6, and thereupon, the capacitor C1 starts to integrate the current in the same manner as described above. At a time t7, the range is changed from low to high so that from the time t7, capacitors C1 and C2 start to integrate the current. Since the target object in this operation is not as bright as that in the first operation, the measuring period ends before voltage V2 reaches the voltage Vr'. Accordingly, at the end of the measuring period, i.e., at a time t8, the switching circuit X produces from its terminal Q a high level signal indicative of the high range, and the switching circuit Y produces from its terminal Q' a low level signal. Accordingly, the AND gates AN1, AN2 and AN3 respectively produce low, high and low level signals. Thus, the switch SW6 is turned on to supply a discharging current determined by the parallel connected resistors R1 and R3, i.e., the current is equal to $Vs(r1+r3)/r1 \cdot r3$ and flows through the switch SW4. Then, the discharging period T2 is measured, and thereafter, the amount of light is calculated and displayed.

When compared with the first measuring operation, the capacitors C1 and C2 in the second measuring operation are charged with a smaller amount of charge, so that if the discharging current is set at the same level during the first and second operations, i.e., during the high range in a manner described above with respect to the first embodiment (FIG. 1), the discharging period would vary from a very short period to a very long period. Although it is preferable to shorten the discharging period and this can be accomplished by an increase of the discharging current level, the reckless increase of the discharging current results in a loss of preciseness, particularly when the capacitors C1 and C2 are charged to a low level.

In view of this, the light measuring device according to the second embodiment changes the discharging current between first and second operations such that the discharging current during the first operation is arranged to have a greater value than the discharging current during the second operation so as to make the operating period fall within a predetermined short period of time and yet maintaining the required preciseness of any operations in the high range. For this purpose, the resistors R1, R3 and R4 are preselected in such a relationship that:

$$r1 \cdot r4/(r1+r4) < r1 \cdot r3/(r1+r3) \quad (6)$$

and therefore, $$r4 < r3.$$

The third operation starts by the receipt of the start signal at a time t10, and thereupon, the capacitor C1 starts to charge current in the same manner described above. At a time t11, the voltage V2 exceeds the reference voltage Vr', and then the measuring period ends at a time t12 without reaching the voltage Vr. Thus, it is understood that the third measuring operation is carried out under the low range. Therefore, at the time t12, the terminal Q of the switching circuit X produces a low level signal and the terminal Q' of the switching circuit Y produces a high level signal. Accordingly, the AND gates AN1, AN2 and AN3 respectively produce low, low and high level signals. Thus, the switch SW5 is turned on to supply discharging current determined by the parallel connected resistors R1 and R2, i.e., the current is equal to $Vs(r1+r2)/r1 \cdot r2$ and flows through the switch SW4. Then, the discharging period T3 is measured, and thereafter, the amount of light is calculated and displayed.

The fourth operation starts by the receipt of the start signal at a time t14, and thereupon, the capacitor C1 starts to be charged with the current from the selected photodiode, e.g., SPD1. Since the brightness of the target object is very low, the voltage V2 increases very slowly. Thus, at the end of the measuring period, i.e., at a time t15, the voltage V2 is still under the reference voltage Vr'. In this measuring operation, the range is low. Accordingly, at the time t15, the terminal Q of the switching circuit X produces a low level signal and the terminal Q' of the switching circuit Y produces a low level signal. Accordingly, all the AND gates AN1, AN2 and AN3 produce low level signals so as to maintain all the switches SW5, SW6 and SW7 off. Therefore, in this case, the charged capacitor C1 is discharged by a current which is equal to Vs/r1.

It is to be noted that the resistors R1 and R2 are preselected to meet the requirement as follows for the same purpose described above.

$$r1 \cdot r2/(r1+r2) < r1 \quad (7)$$

and therefore, $$r1 > 0.$$

It is further to be noted that the resistors R1, R2 and R4 and capacitors C1 and C2 have the following relationship from the same view point described above in connection with equations (1) to (5).

$$\frac{r1 \cdot r2/(r1+r2)}{r1 \cdot r4/(r1+r4)} = \frac{c1+c2}{c1} \quad (8)$$

Similarly, the resistors R1 and R3 and capacitors C1 and C2 have the following relationship.

$$\frac{r1}{r1 \cdot r3/(r1+r3)} = \frac{c1+c2}{c1} \quad (9)$$

When the above relationships (8) and (9) are satisfied, the discharging time for discharging the capacitor C1 and that for discharging the capacitors C1 and C2 will be the same when the percentage of charged amount in the capacitor C1 under the operation of low range is equal to the percentage of charged amount in the capacitors C1 and C2 under the operation of high range.

Although the second embodiment has two different levels of discharging current in each range, it can be so arranged as to provide three or more different level of discharging current. In this case, it is necessary to provide two or more intermediate reference voltages Vr'.

As described above, since one operation of measuring light amount can be carried out within a predetermined period of time regardless of this brightness of the target object, a series of operations sequentially carried out by the current obtained from the photodiodes SPD1 to SPDK can be effected in a relatively short period of time when compared with a light measuring device which has no means to control the discharging current.

Figure 5:
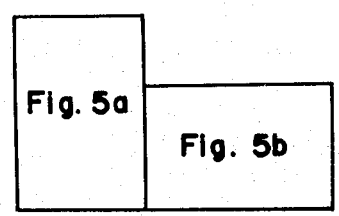
FIGS. 5a and 5b taken together as in FIG. 5 show a circuit diagram of a light measuring device according to the third embodiment of the present invention.
Figure 5A:
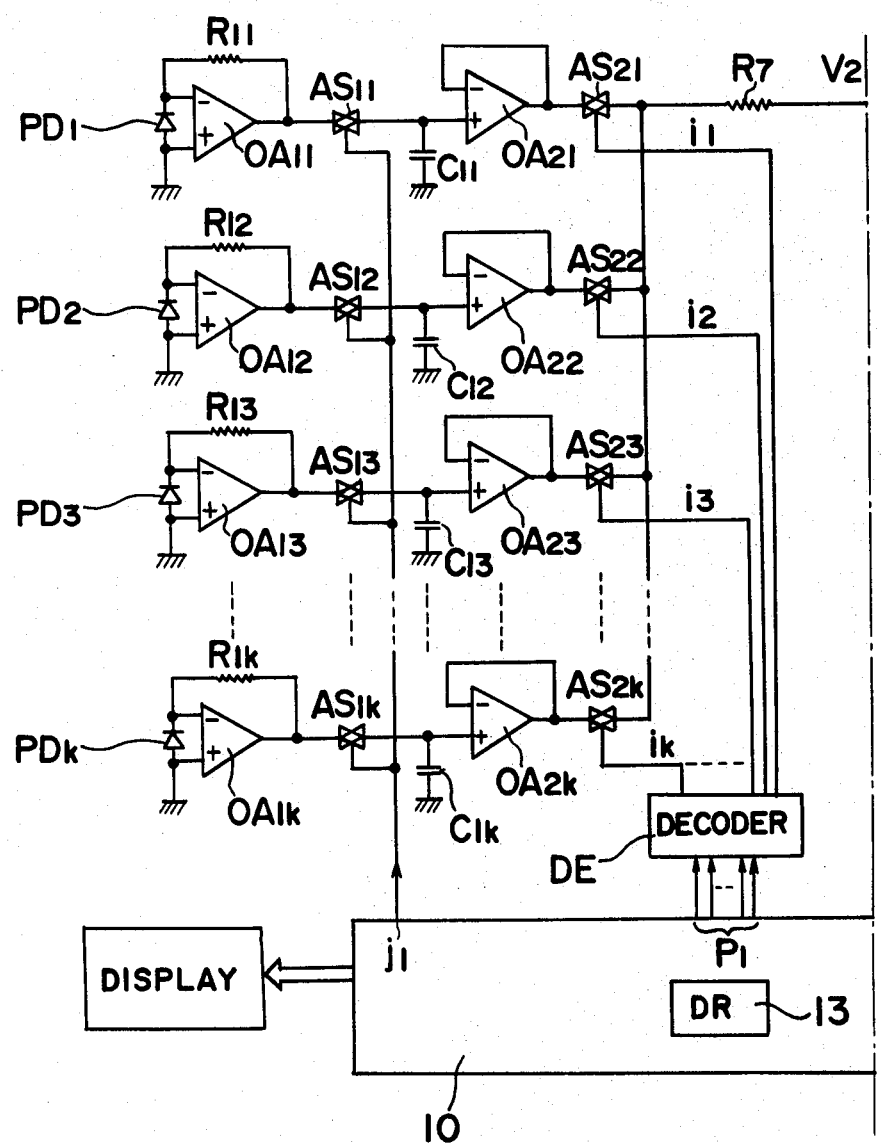
Figure 5B:
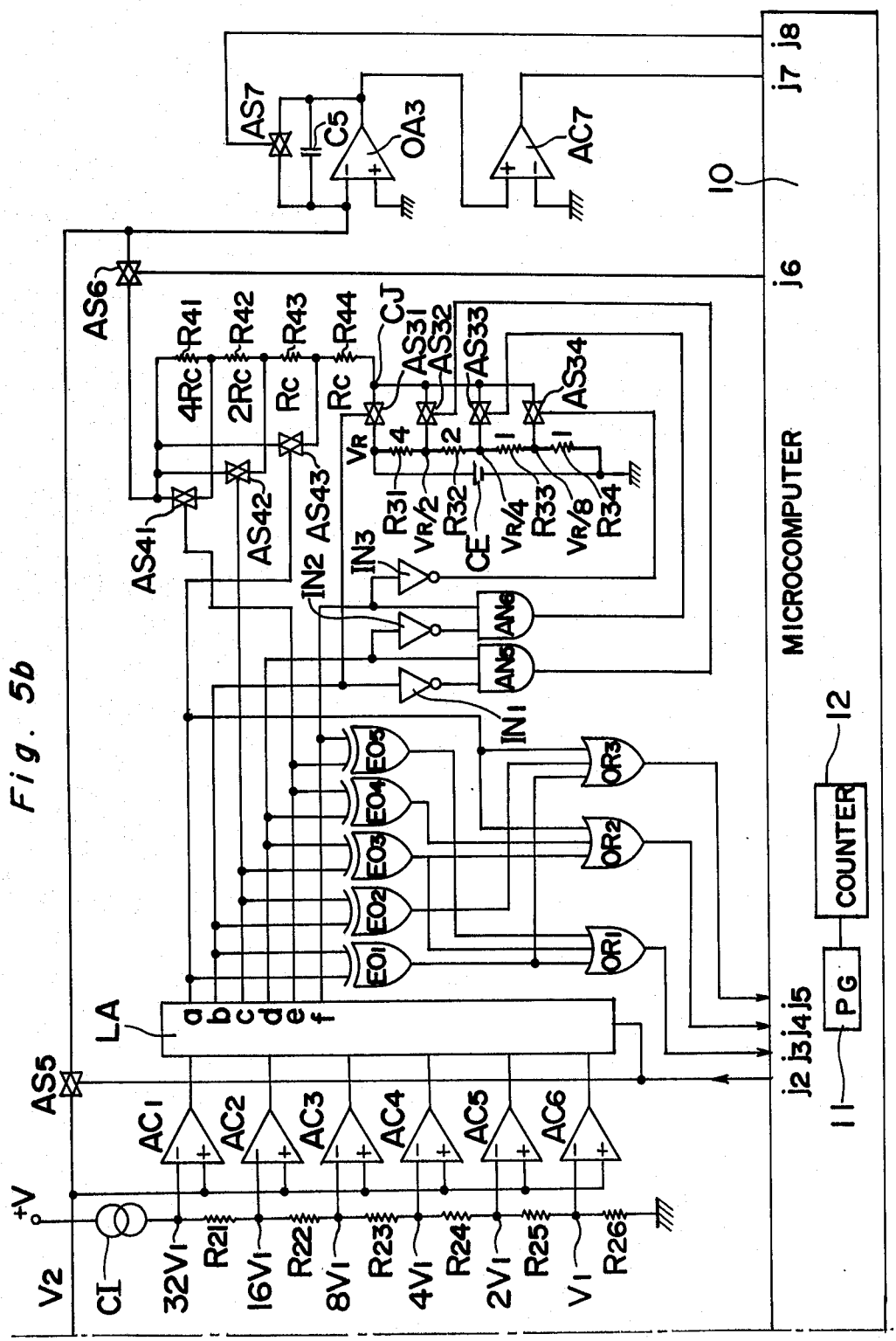

Referring to FIGS. 5a and 5b, there is shown a third embodiment of the light measuring device. First, the outstanding features of the light measuring device of the third embodiment is described. According to this embodiment, an analog signal V2 indicative of a light intensity is measured so as to determine which of seven ranges, i.e., 0–V1, V1–2V1, 2V1–4V1, 4V1–8V1, 8V1–16V1, 16V1–32V1 and 32V1–64V1, it falls in. A circuit for effecting this determination includes a constant current source CI, resistors R21 to R26 and comparators AC1 to AC6. The output signals obtained from the comparators AC1 to AC6 are latched in a latch circuit LA, and are further produced from output terminals a, b, c, d, e and f of the latch circuit LA. It is to be noted that the resistors R21 to R26 have the following resistances.

R26 = R25 = r
R24 = 2r
R23 = 4r
R22 = 8r
R21 = 16r

Accordingly, when the voltage at a junction between the resistors R25 and R26 is V1, the voltage at a junction between the resistors R24 and R25 is 2V1, between the resistors R23 and R24 is 4V1, between the resistors R22 and R23 is 8V1, between the resistors R21 and R22 is 16V1, and between the current source CI and resistor R21 is 32V1. Accordingly, the combination of binary signals obtained from the output terminals a to f for each of the seven ranges can be given by a following Table 1.

TABLE 1

| | RANGE | a | b | c | d | e | f | j5 | j4 | j3 |
|---|---|---|---|---|---|---|---|---|---|---|
| (1) | 0–V1 | 0 | 0 | 0 | 0 | 0 | 0 | 0 | 0 | 0 |
| (2) | V1–2V1 | 0 | 0 | 0 | 0 | 0 | 1 | 0 | 0 | 1 |
| (3) | 2V1–4V1 | 0 | 0 | 0 | 0 | 1 | 1 | 0 | 1 | 0 |
| (4) | 4V1–8V1 | 0 | 0 | 0 | 1 | 1 | 1 | 0 | 1 | 1 |
| (5) | 8V1–16V1 | 0 | 0 | 1 | 1 | 1 | 1 | 1 | 0 | 0 |
| (6) | 16V1–32V1 | 0 | 1 | 1 | 1 | 1 | 1 | 1 | 0 | 1 |
| (7) | 32V1–64V1 | 1 | 1 | 1 | 1 | 1 | 1 | 1 | 1 | 0 |

In Table 1, characters j5, j4 and j3 designate a 3-bit binary code representing the seven ranges using BCD numerals 000 to 110. As is apparent from Table 1, the logical statements of characters j5, j4 and j3 can be given by the following mathematical form using the logical statements of the output terminals a to f.

$$j3 = (a \oplus b) + (c \oplus d) + (e \oplus f) \quad (10)$$

$$j4 = (c \oplus d) + (d \oplus e) + a \quad (11)$$

$$j5 = (a \oplus b) + (b \oplus c) + a \quad (12)$$

AS41 is on, the total discharging resistance is 4Rc, when the switch AS42 is on, the resistance is 2Rc and when the switch AS43 is on, the resistance is Rc.

According to the third embodiment, a predetermined discharging current having different levels is presented through an analog switch AS6 to a capacitor C5. The level of the discharging current I is determined for each of the seven ranges as shown in Table 2 below.

TABLE 2

| RANGE | a | b | c | d | e | f | AS31 | AS32 | AS33 | AS34 | AS41 | AS42 | AS43 | V | R | I |
|---|---|---|---|---|---|---|---|---|---|---|---|---|---|---|---|---|
| 1 | 0 | 0 | 0 | 0 | 0 | 0 | 0 | 0 | 0 | 1 | 0 | 0 | 0 | VR/8 | 8Rc | VR/64Rc |
| 2 | 0 | 0 | 0 | 0 | 0 | 1 | 0 | 0 | 1 | 0 | 0 | 0 | 0 | VR/4 | 8Rc | VR/32Rc |
| 3 | 0 | 0 | 0 | 0 | 1 | 1 | 0 | 0 | 1 | 0 | 1 | 0 | 0 | VR/4 | 4Rc | VR/16Rc |
| 4 | 0 | 0 | 0 | 1 | 1 | 1 | 0 | 1 | 0 | 0 | 1 | 0 | 0 | VR/2 | 4Rc | VR/8Rc |
| 5 | 0 | 0 | 1 | 1 | 1 | 1 | 0 | 1 | 0 | 0 | 1 | 1 | 0 | VR/2 | 2Rc | VR/4Rc |
| 6 | 0 | 1 | 1 | 1 | 1 | 1 | 1 | 0 | 0 | 0 | 1 | 1 | 0 | VR | 2Rc | VR/2Rc |
| 7 | 1 | 1 | 1 | 1 | 1 | 1 | 1 | 0 | 0 | 0 | 1 | 1 | 1 | VR | Rc | VR/Rc | wherein a symbol "+" represents logical OR and a symbol "$\oplus$" represents logical EXCLUSIVE OR. A logic circuit that satisfies the above equations (10), (11) and (12) is formed by EXCLUSIVE OR gates EO1 to EO5 and OR gates OR1 to OR3 which are arranged in a manner shown in FIG. 5b. Accordingly, the outputs produced from the OR gates OR1, OR2 and OR3 correspond to logic statements given under the characters j5, j4 and j3, which characters are used in FIG. 5b for designating the input ports of microcomputer 10. In other words, the 3-bit binary code is applied to the input ports j5, j4 and j3 of the microcomputer 10 for designating the determined range.

A constant voltage source CE (FIG. 5b) produces a constant voltage VR and is connected across series connected resistors R31, R32, R33 and R34. The resistance ratio of the resistors R31, R32, R33 and R34 is such that $$r31:r32:r33:r34 = 4:2:1:1$$

Accordingly, at a junction between the constant voltage source CE and resistor R31 is produced a voltage VR, at a junction between resistors R31 and R32 is produced a voltage VR/2, at a junction between resistors R32 and R33 is produced a voltage VR/4 and at a junction between resistors R33 and R34 is produced a voltage VR/8. These voltages VR, VR/2, VR/4 and VR/8 are used for respectively generating different levels of discharging currents through analog switches AS31, AS32, AS33 and AS34. The analog switches AS31 to AS34 are connected together at a common junction CJ and are further connected to discharging resistors R41, R42, R43 and R44, which are connected in series. The resistors R41 to R44 have the following resistance relationship.

$$R41 = 4Rc$$

$$R42 = 2Rc$$

$$R43 = R44 = Rc$$

An analog switch AS41 is connected in parallel with the resistor R41, and similarly, an analog switch AS42 is connected in parallel with the resistors R41 and R42 and an analog switch AS43 is connected in parallel with the resistors R41, R42 and R43. Accordingly, when all the switches AS41, AS42 and AS43 are off, the total discharging resistance is 8Rc. When only the switch When the voltage V2 is below the voltage V1, the lowest range, i.e., range 1, is determined, and accordingly, the latch LA produces no high level signal from the output terminals a to f, and thus, only the switch AS34 is turned on. Accordingly, the voltage level V at the common junction CJ is VR/8 while effective resistance R is 8Rc. Thus, the current I that flows through the switch AS6 is VR/64Rc. Other discharging current levels are determined in a similar manner. As is apparent from Table 2, the state of the switch AS31 corresponds to the state of the terminal b and this statement can be mathematically expressed as $$(AS31 \text{ on}) = b$$

Similarly, the state of other switches can be mathematically expressed as follows.

$$(AS32 \text{ on}) = \bar{b} \cdot d$$

$$(AS33 \text{ on}) = \bar{d} \cdot f$$

$$(AS34 \text{ on}) = \bar{f}$$

$$(AS41 \text{ on}) = e$$

$$(AS42 \text{ on}) = c$$

$$(AS43 \text{ on}) = a$$

wherein a symbol "$\bar{b}$" represents the NOT of b and a symbol "." represents logical AND. A logic circuit that satisfies the above-noted logical equations and is formed by AND gates AN5 and AN6 and inverters IN1, IN2 and IN3, as shown in FIG. 5b.

It is to be noted that although only a capacitor C5 is shown in FIG. 5b as the integration capacitor, the light measuring device according to the third embodiment further includes another integration capacitor applied in a similar manner described above in the previous embodiments. Therefore, the operation of the light measuring device of the third embodiment described hereinbelow is understood as carried out under the low range explained in the previous embodiments. Furthermore, the ranges 1 to 7 described in this embodiment are understood to be the sub-ranges for each of the low and high ranges.

Next, the operation of the light measuring device of the fifth embodiment is described with reference to a flow chart of microcomputer 10 shown in FIG. 6.

When a start signal is supplied to the microcomputer 10, a high level signal is produced from an output port j1 of the microcomputer 10 to turn on analog switches AS11 to AS1k, and accordingly, voltages obtained across resistors R11 to R1k, which correspond to the intensities of the light received by the photodiodes PD1 to PDk are respectively stored by capacitors C11 to C1k. An output port j8 then produces a high level signal for turning on the analog switch AS 7 to discharge the capacitor C5. Thereafter, output ports j2 and j6 produce a low level signal to turn the charge and discharge switches AS5 and AS6 off. Then, in the step #4, data that designates the measured output to be processed and A/D converted is set up in the data register 13, and in this case, such data is equal to "1". Thereafter, when the output port j1 produces a low level signal, all the switches AS11 to AS1k are turned off to prevent any further signal from being supplied to the capacitors C11 to C1k. Accordingly, each of the capacitors C11 to C1K holds the outputs of operational amplifiers OA11 to OA1k obtained during the on state of the switches AS11 to AS1k.

It is to be noted that in the previous embodiments, the integration capacitor or capacitors are so arranged that they are charged with current which may vary with a change of brightness of the target object during the light receiving period. On the contrary, according to the third embodiment, the holding or storage capacitors, e.g., capacitors C11 to C1k hold instantaneous output voltages of the light measuring circuits and therefore, the integration capacitor C5 is so arranged as to be charged with constant currents commensurate with the output voltages. From this point, it can be said that the light measuring device according to the present invention can measure not only the amount of light based on the integration of a light intensity which has been measured for a prolonged period of time but also light intensity which has been measured instantaneously.

Then, in the step #6, the content of the data register 13, i.e., the data equal to "1", is supplied through the output port P1 to the decoder DE which thereupon produces a high level signal from one of its output terminals i1 to ik. The output terminal that produces the high level signal corresponds to the data obtained from the data register 13. In this case, the terminal i1 produces the high level signal. Therefore, the switch AS21 is turned on, and accordingly, the voltage corresponding to the measured light intensity and produced from the capacitor C11 is supplied through a buffer amplifier OA21 and the switch AS21 to a charging current control resistor R7. The voltage corresponding to the stored voltage on the capacitor C11 and produced from the resistor R7 is compared with a plurality of reference voltages in the comparators AC1 to AC6. Then, in the step #7, the output port j8 produces a low level signal that turns the switch AS7 off, and thus, the capacitor C5 is ready for the charge. A high level signal is then produced from output port j2 to turn the switch AS5 on for supplying a charging current to the capacitor C5. The high level signal from the output port j2 also actuates the latch LA to receive the output signals from the comparators AC1 to AC6, and accordingly, the latch LA produces a high or low level signal from its output terminals a to f for the indication of the determined range. When the switch AS5 is turned on, a current determined by a voltage Vi produced from the buffer amplifier OA21 and resistance r7 of the resistor R7, i.e., Vi/r7, is supplied to the capacitor C5 for the integration. Simultaneously with the turning on of the switch AS5, a counter 12 starts to count pulses obtained from a pulse generator 11 so as to measure a predetermined period of time.

When the counter 12 completes its counting, i.e., when the predetermined period has passed, the output port j2 produces a low level signal for turning the switch AS5 off, and accordingly, the current integration in the capacitor C5 ends. Then, the output port j6 produces a high level signal for turning the switch AS6 on for supplying the discharging current, whose value is in accordance with the determined range, to the capacitor C5. Simultaneously with the turning on of the switch AS6, the counter 12 starts to count pulses for the count of discharging time. When the capacitor C5 is completely discharged, that is, when the output of the operational amplifier OA3 reaches the ground level, the comparator AC7 produces a high level signal which is supplied to the microcomputer 10 through an input port j7. By the high level signal supplied to the input port j7, the microcomputer 10 stops measuring time in the counter 12, and at the same time, reads data corresponding to the determined range by reading the signals obtained from the input ports j3, j4 and j5.

Thereafter, the output port j6 produces a low level signal which turns off the switch AS6, and at the same time, the output port j8 produces a high level signal which turns on the switch AS7 to secure the complete discharge of the capacitor C5. Then, a "1" is added to the content of data register 13. Accordingly, the data register 13, which has been storing a "1", now stores a "2". In the step #19, it is determined whether or not the content of the data register 13 has changed to k+1. If not, the procedure returns back to the step #6 to repeat the above described operation. According to this case, the content is "2" so that the procedure repeats again. In the second procedure, the decode DE produces a high level signal from its terminal 12 to the switch AS22 to supply voltage from the second buffer amplifier OA22. The procedure is repeated k times, and thereafter, the microcomputer 10 calculates the measured amount of light, and the calculated amount is displayed through a display device 20.

When carrying out the calculation, there are two steps to be effected: a step for changing the measured data from the time domain to the light intensity domain; and a step for multiplying the measured data by a certain number which is determined by the determined range. The former step is referred to as a domain changing step and the latter step is referred to as a decimal point shifting step, since according to the preferred embodiment, the multiplication is effected by the shift of the decimal point. It is to be noted that the domain changing step and the decimal point shifting step can be carried out in said order or in the opposite order. Furthermore, since a plurality of light amounts are available before the calculation step #20, it is possible to provide a calculation program of spectrum analysis or a calculation program of light distribution analysis in multi-divided sections.

Next, a preferred calculation for the decimal point shifting step is described.

The measuring of the discharging time is effected by the counting number of clock pulses, and when the operation is carried out under the range 1, one clock pulse is weighted with a predetermined voltage, 100 $\mu V$ which is determined by the resistance, capacitance and voltage of the elements employed in the circuit. When the available number of pulses under the range 1 is 0–1023, it is possible to measure 0–102.3 mV under the range 1. For the range 2, one pulse is weighted 200 μV and the available number of pulses is 512–1023. Thus, it is possible to measure 102.4 mV–204.6 mV in the range 2. Likewise, the clock pulse is weighted differently for each range, and accordingly, the available measuring voltage range is different, as shown in Table 3.

TABLE 3

| RANGE | weighted voltage/pulse (μV) | available number of pulses | measurable range (mV) |
|---|---|---|---|
| 1 | 100 | 0–1023 | 0–102.3 |
| 2 | 200 | 512–1023 | 102.4–204.6 |
| 3 | 400 | 512–1023 | 204.8–409.2 |
| 4 | 800 | 512–1023 | 409.6–818.4 |
| 5 | 1600 | 512–1023 | 819.2–1636.8 |
| 6 | 3200 | 512–1023 | 1638.4–3273.6 |
| 7 | 6400 | 512–1023 | 3276.8–6547.2 |

The reason for setting the lower limit of the available number of pulses to 512 is to fix the error within 0.2%. For example, when counting the number of pulses under the range 2, one pulse is weighted 200 μV so that there is a 200 μV gap between two neighboring pulses. Such a gap results in an error which becomes serious as the number of counted pulses becomes small. When the counted number of pulses is 500, the error is $100 \cdot 1/500 = 0.2(\%)$. Since there are more than 500 pulses to be counted in the ranges 2 to 7, the measuring error is maintained less than 0.2(%).

Since the calculation carried out in the microcomputer is effected by a so-called binary coded numbering system, the shifting of decimal point one place towards right results in multiplication of $x2^1$. Likewise, two place shifting results in $x2^2$, three place shifting results in $x2^3$, and so on. Since the weighted voltage increases in this rate, the wanted voltage can be obtained by shifting the decimal point of a number of counted pulses by a required number of places determined by the determined range.

As is apparent from Table 3, the light measuring device according to the third embodiment can measure a voltage which is between 0 and 6547.2 mV ($=2^{16}$ mV), and such a measurement can be carried out within a period of time necessary to count clock pulses of a number less than 1024 ($=2^{10}$). Particularly for the operations under the ranges 2 to 7, the number of pulses to be counted is above 512 so that during the counting of pulses up to 512, the microcomputer 10 can be used for processing some other process. For example, when there are a plurality of measured values to be taken and processed in the microcomputer as in the example of the third embodiment, the previously measured values can be processed in the counting period.

Furthermore, since the measuring period can be limited to a predetermined time length, the timing for producing a signal that starts the A/D conversion for each of the plurality of measuring operations can be simply arranged. Furthermore, the present invention does not require adjustment for synchronization between the time when the level or value of the discharge current is switched and the time of rise-up or drop of a clock pulse for the counting.

Although the light measuring device according to the third embodiment includes means for controlling the integration and means for controlling the time measurement and these means are incorporated in the microcomputer, they can be formed by any other known devices coupled to an A/D converter. In this case, the A/D converter can be so arranged as to produce two outputs, respectively bearing the data of the counted value and the determined range, or to produce an output bearing the information of the counted value that has been shifted relying on the selected range.

Figure 6:
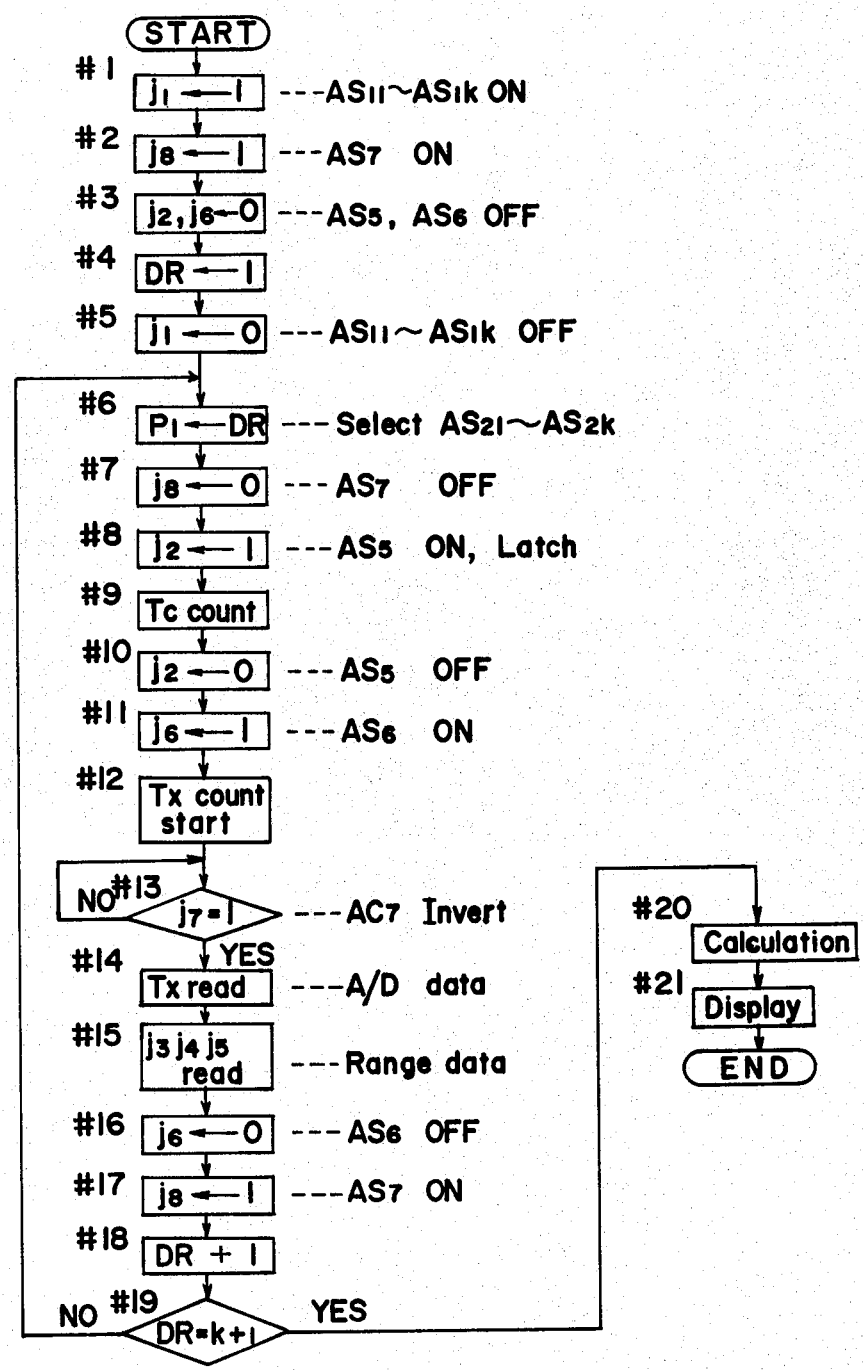
FIG. 6 is a flow chart showing the process carried out in the microcomputer employed in the device of the third embodiment.

Furthermore, although the flow chart shown in FIG. 6 is so designed as to repeatedly carry out the measuring operations k times, before the calculation procedure takes place, it can be so designed as to carry out the calculation and displaying after each measuring operation. In the simplest case, the light measuring circuit may be singular in which case the present invention will also be effective.

It is to be noted that the number of ranges may be increased to 8 or 9 ranges with the whole measurable range remaining the same. In such case, the available number of pulses ranges from 1 to 511 for the first range and from 256 to 511 for the remaining ranges for the eight-range measurement, while the available number of pulses ranges from 1 to 255 for the first range and from 128 to 255 for the remaining ranges for the nine-range measurement.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of appended claims.

What is claimed is:

1. A light measuring device having a plurality of ranges for measuring light and comprising:
   a light responsive means for receiving light and for producing an electrical signal as a function of the received light;
   an integration means including a capacitor means for integrating said electrical signal so as to change the amount of charge stored in said capacitor means;
   a first control means for controlling the integration means such that said electrical signal is integrated during a predetermined period of time;
   a means for setting said capacitor means to a predetermined initial condition before the integration of said electrical signal;
   a means for producing a plurality of constant currents having different levels;
   a means for selecting one of said plurality of constant currents in dependence on said changed amount of charge in said capacitor means;
   a second control means for controlling said constant current producing means such that said selected constant current is supplied to or withdrawn from said capacitor means subsequent to the completion of said integration of said electrical signal for said predetermined periodd of time; so as to again place said capacitor means to its predetermined initial condition;
   a means for detecting the moment of time when said capacitor means again reaches said predetermined initial condition due to said selected constant current; and
   a means for measuring the time interval from the moment of time when said constant current producing means starts to supply said selected constant current to said capacitor means to the moment of time when said detecting means detects that said capacitor means has again reached said predetermined initial condition.

2. A light measuring device as claimed in claim 1, wherein said selecting means comprises:
   a means for detecting which of a plurality of ranges said changed amount of charge falls in, the number of said ranges being identical to the number of constant currents; and
   a means for driving said current producing means so as to produce one constant current corresponding to the detected range.

3. A light measuring device as claimed in claim 1, wherein said light responsive means comprises a plurality of light receiving elements.

4. A light measuring device as claimed in claim 3, further comprising a third control means for effecting a sequential supply of electrical signals to said integration means, wherein said electrical signals are commensurate with the measured light intensity received by said light receiving elements.

5. A light measuring devide as claimed in claim 1, further comprising a means for changing states of said capacitor means between at least first and second states, wherein said first state provides a first capacitance and said second state provides a second capacitance which is greater than said first capacitance, and wherein said selecting means includes a means for selecting a constant voltage in accordance with said state of said capacitor means.

6. A light measuring device as claimed in claim 5, further comprising:
   a means for generating an integration signal as a function of said changed amount of charge in said capacitor means;
   wherein said means for changing states of said capacitor means includes:
   a means for generating a reference signal and
   a comparator means for comparing said integration signal with said reference signal and for producing a shift signal when said integration signal becomes substantially equal to said reference signal, said comparator means being coupled to said integration means for changing said capacitor means from said first state to second state when said shift signal is produced.

7. A light measuring device as claimed in claim 6, wherein said integration signal generating means includes a means for detecting a voltage change caused by said change of amount of charge stored in said capacitor means.

8. A light measuring device as claimed in claim 5, wherein said capacitor means comprises a first capacitor connected to said light responsive means and a second capacitor connected in parallel with said first capacitor through a first switch means, said first state being obtained when said first switch means is opened to disconnect said second capacitor from said first capacitor, and said second state being obtained when said first switch means is closed to connect said second capacitor in parallel with to said first capacitor.

9. A light measuring device as claimed in claim 8, wherein said selecting means comprises:
   a means for determining which of a plurality of ranges said changed amount of charge falls in, the number of said ranges being identical to the number of constant currents; and
   a means for driving said current producing means so as to produce one constant current corresponding to said range which has been determined by said determining means.

10. A light measuring device as claimed in claim 9, wherein said determining means comprises a number detecting means for detecting the number of capacitors used for integrating said electrical signal.

11. A light measuring device as claimed in claim 10, wherein said determining means further comprises a voltage detecting means for detecting voltage a across said capacitor means.

12. A light measuring device as claimed in claim 1, wherein said light responsive means includes a photodiode.

13. A light measuring device as claimed in claim 1, wherein said setting means sets said capacitor means to a zero stored changed condition as said predetermined initial condition.

14. A light measuring device as claimed in claim 1, further comprising an analog-to-digital converting means for converting the time interval measured by said means for measuring a time interval into a digital signal.

15. A light measuring device as claimed in claim 1, further comprising a calculation means for calculating the amount of light received by said responsive means based on the changed amount of charge in said capacitor means.

16. A light measuring device having a plurality of ranges for measuring light and comprising:
   a light responsive means for receiving light and for producing a voltage signal as a function of the received light;
   an integration means, including both a means for generating an electric current commensurate with said voltage signal and a capacitor means, for integrating said electric current so as to change the amount of charge stored in said capacitor means;
   a first control means for controlling the integration means such that said integration is effected during a predetermined period of time;
   a means for setting said capacitor means to a predetermined initial condition before said integration;
   a means for producing a plurality of constant currents having different levels;
   a means for selecting one of said constant currents in dependence upon said voltage signal;
   a second control means for controlling said constant current producing means such that said selected current is supplied to or withdrawn from said capacitor means subsequent to the end of said predetermined period of time so as to again place said capacitor in its predetermined initial condition;
   a means for detecting the moment of time when said capacitor means again reaches said predetermined initial condition due to said selected constant current; and
   a means for measuring the time interval from the moment of time when said constant current producing means starts to supply said selected constant current to said capacitor means to the moment of time when said detecting means detects that said capacitor means has again reached said predetermined initial condition.

17. A light measuring device as claimed in claim 16, wherein said light responsive means comprises a holding capacitor means for holding a voltage signal.

18. A light measuring device as claimed in claim 17, wherein said selecting means further comprises means for selecting one constant current in dependence upon said voltage signal.

19. A light measuring device as claimed in claim 18, wherein said selecting means comprises:
- a means for determining which of a plurality of ranges said voltage signal falls in, the number of said ranges being identical to the number of constant currents; and
- a means for driving said current producing means so as to produce one constant current corresponding to said range which has been determined by said determining means.

20. A light measuring device as claimed in claim 16, wherein said light receiving means comprises a plurality of light receiving elements.

21. A light measuring device as claimed in claim 20, further comprising a third control means for selectively coupling said light receiving elements to said integration means.

22. A light measuring device of the integration type comprising:
- a light responsive means for generating an output as a function of light received thereby;
- an integration means, including a capacitor means which is chargeable, for integrating the output of said light responsive means for a given time period and for generating an integration output representative of the integrated value;
- a discharge means for discharging said capacitor means that has been charged to a level commensurate with the integration output, said discharge means including a plurality of discharge paths for respectively discharging said capacitor means with constant currents of different values;
- a means for selecting the discharge path in accordance with the level of said integration output; and
- means for generating a digital signal as a function of the time during which said charged capacitor is discharged to a given level.

23. A light measuring device as claimed in claim 22, wherein said integrating means includes a means for changing the capacitance of said capacitor means and wherein said selecting means is adapted to select said discharge path in accordance with the changed capacitance.

24. A light measuring device as claimed in claim 22, wherein said selecting means includes means for detecting the charged voltage of said capacitor means and a means for selecting said discharge path in accordance with the detected voltage.

25. A light measuring device as claimed in claim 22, wherein said light responsive means includes a plurality of photoelectric elements and a means for selectively connecting said photoelectric elements to said integration means.

26. A light measuring device as claimed in claim 22, wherein said integration means includes means for detecting the charged voltage of said capacitor means and a means for changing the capacitance of said capacitor means when the detected charged voltage attains a predetermined level during the operation of said integration means, and wherein said selecting means includes a means for selecting the discharge path in accordance with whether the capacitance of said capacitor means has been changed.

27. A light measuring device as claimed in claim 26, wherein said selecting means further includes a means for selecting the discharge path in accordance with the charged voltage of said capacitance means upon the completion of said integration.

28. A light measuring device as claimed in claim 22, further comprising an indication means for indicating the light intensity measurement in accordance with the digital signal from said means for generating a digital signal.

29. A light measuring device of the integration type comprising:
- a light responsive means for generating an output as a function of light received thereby;
- an integration means including a capacitor means which is chargeable for integrating the output of said light responsive means for a given time period and for generating an integration output representative of the integrated value;
- a discharge means for discharging said capacitor means that has been charged to a level commensurate with the integration output, said discharge means including a plurality of discharge paths for respectively discharging said capacitor means with constant currents of different values;
- a means for selecting the discharge path in accordance with the level of the output of said light responsive means; and
- a means for generating a digital signal as a function of the time during which said charged capacitor is discharged to a given level.

30. A light measuring device as claimed in claim 29, wherein said light responsive means includes a photoelectric means for generating a photoelectric signal as a function of the intensity of the light received thereby and a means for storing said photoelectric signal.

31. A light measuring device as claimed in claim 30, wherein said photoelectric means includes a plurality of photoelectric elements which respectively generate photoelectric outputs and wherein said storing means includes a plurality of storage members which are respectively coupled to said photoelectric elements to store their outputs.

32. A light measuring device as claimed in claim 31, further comprising a means for selectively coupling said storage members to said integration means.

33. A light measuring device of the integration type comprising:
- a light responsive means for generating an output as a function of the intensity of the light received thereby;
- an integration means for integrating the output of said light responsive means for a given period of time;
- a reverse integration means for reversely integrating the integrated output by means of a constant current;
- a means for selecting the level of said constant current from a plurality of predetermined different levels in accordance with the integrated output; and
- a means for generating a digital signal as a function of the time duration of said reverse integration.

34. A light measuring device of the integration type comprising:
- a light responsive means for generating an output as a function of the intensity of the light received thereby;

an integration means for integrating the output of said light responsive means for a given period of time;

a reverse integration means for reversely integrating the integrated output by means of a constant current;

a means for selecting the level of said constant current from a plurality of predetermined different levels in accordance with the output of said light responsive means; and a means for generating a digital signal as a function of the time duration of said reverse integration.

35. A light measuring device comprising:

a light responsive means for generating an output as a function of the intensity of the light received thereby;

an integration means, including a capacitor means, whose charge changes from its initial amount to an integrated amount commensurate with the integration of said output for a given time;

a reverse integration means for changing the charge stored in said capacitance means from said integrated amount to said initial amount by means of a constant current;

a range detection means for detecting which one of a plurality of ranges of light measurement the light being measured falls in;

a selection means for selecting the level of said constant current from a plurality of predetermined different levels in accordance with the detected range; and a means for generating a digital signal as a function of the time duration of the reverse integration.

* * * * *